United States Patent [19]

Wakatsuki

[11] Patent Number: 4,986,618

[45] Date of Patent: Jan. 22, 1991

[54] MEMORY CARD STORAGE DEVICE

[75] Inventor: Hiroshi Wakatsuki, Tokyo, Japan

[73] Assignee: Kabushiki Kaisha TOPCON, Tokyo, Japan

[21] Appl. No.: 363,096

[22] Filed: Jun. 8, 1989

[30] Foreign Application Priority Data

Jul. 1, 1988 [JP] Japan .................. 63-162475

[51] Int. Cl.⁵ .............................................. A47B 81/00
[52] U.S. Cl. .................................... 312/276; 312/328
[58] Field of Search ............ 312/328, 329, 325, 321.5, 312/319, 272.5, 274, 275, 276

[56] References Cited

U.S. PATENT DOCUMENTS

| | | | |
|---|---|---|---|
| 2,187,320 | 1/1940 | Hoffstetter et al. | 312/328 |
| 2,363,149 | 11/1941 | Rousso | 312/328 |
| 2,570,054 | 10/1951 | Gardner | 312/276 X |
| 2,690,945 | 10/1954 | Bront | 312/325 X |
| 2,775,230 | 12/1956 | Craig | 312/328 |
| 2,786,730 | 3/1957 | Thurston | 312/328 X |
| 2,849,270 | 8/1958 | Warnock | 312/328 |
| 4,368,937 | 1/1983 | Palombo et al. | 312/325 |

Primary Examiner—Joseph Falk
Attorney, Agent, or Firm—Henry C. Nields

[57] ABSTRACT

A memory card storage device is adapted to be used in various electronic apparatus, in which a memory card is used. The device has a lid so hinged to a case of a main body of the apparatus as to open receiving the memory card, a card connector slidably mounted in the lid, and a revolving link pivotted at a part of the case near the front end of the lid. The revolving link and the card connector are so connected as to interlock. The case and the lid form a closed space storing the memory card when the lid is closed. The memory card is stored in the closed space. When the lid is open, the link revolves and the connector is drawn toward the outside of the case, ejecting the memory card.

4 Claims, 5 Drawing Sheets

MEMORY CARD STORAGE DEVICE

BACKGROUND OF THE INVENTION

The present invention relates to a memory card storage device of electronic appliances, such as data collectors attached to electronic field or outdoor survey apparatus adopted to survey or measure land distances and gradients in fields of civil engineering and architecture construction.

Nowadays, various survey apparatus used in the fields of civil engineering and architecture have been electronized so as to raise the precision or accuracy and save the labor power in the surveying operation. These survey apparatus of electronic type, respectively, have a data collector in order to raise the speed of data processing and save the labor power used in the surveying operation.

The kind of data collectors have been adopted to process the signal of the inputted information in the predetermined manner and memorize the result in the data collectors, as well as display guidance messages adapted to be used in the survey operation in order to make inputting operations of the operator easy.

It is necessary to have a considerable value of memorizing power for receiving various program which process the signal of inputted information, memorize the data, and display the guidance messages. However, it is necessarily that the data collector is of a handy or small type, and difficult to accommodate various programs for displaying the guidance messages on the data collector. When the collectors are made so as to have a sufficient storage volume for these programs, they will become expensive which is disadvantageous In their pricing.

Under these circumstances, it has been proposed to adopt a memory card as an external memory means and memorize various programs in the memory card. Usually, portable electronic calculators and translators and the like have adopted memory cards which are used after they are partly inserted into the portable electronic devices.

Usually the portable electronic calculators are used inside of a house or building so that it is not occasion to be necessitated of special countermeasure of dust and-/or water-proof with reference to the mechanism in which the memory card is inserted and storaged. Even though when a part of the card is exposed or extended out of the body of the calculators and the like, no trouble will happen in such electronic devices.

On the contrary, the data collectors to which the present invention is applied are used in the outdoor of dust wind or storm, in particular, strong wind and rain in the fields of civil engineering construction and architecture construction. It is noted that it is necessary to secure a reliability of such data collector by adopting countermeasures of dust-prevention thereto when they are used under such bad environment.

Furthermore, when a part of the memory card is exposed from a body of the data collector, it is possible that the memory card as well as the collector are injured accidentally.

SUMMARY OF THE INVENTION

While the present invention is believed to be readily understood from the above description, a brief summary will now be set forth. It is a general object of the present invention to provide, under the circumstances mentioned above, a memory card storage device comprising mainly a card connector adapted to be slidably mounted therein, a lid open and closed so as to accommodate or storage a memory card therein. The memory card storage device is used in an electronic device of the kind using the memory card The memory card storage device according to the present invention has countermeasures or functions of dust-prevention and waterproof.

BRIEF DESCRIPTION OF THE DRAWINGS

Embodiments of the present invention will be now described by way of example and with reference to the accompanying drawings, in which.

DESCRIPTION OF THE PREFERRED EMBODIMENTS

Figure 1:
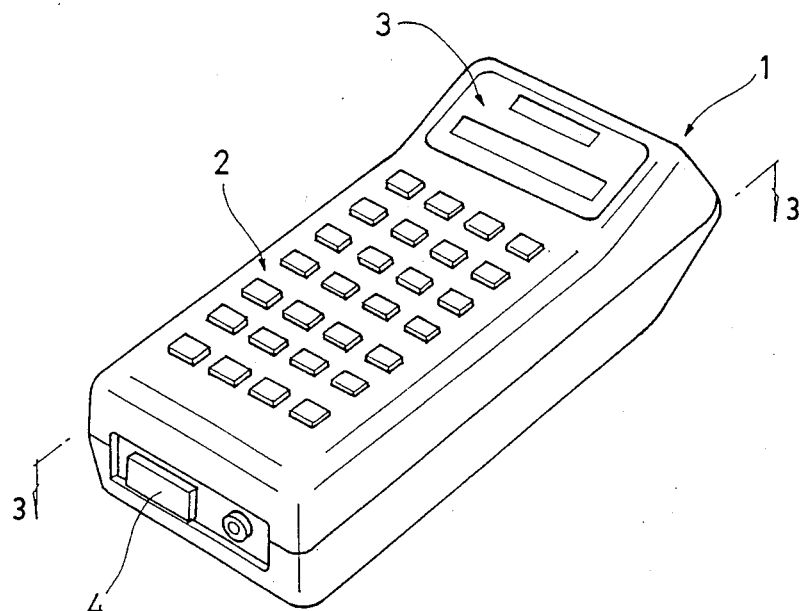
FIG. 1 is a perspective view of an embodiment of the data collector.

FIG. 1 depicts an appearance of a data collector 1 to which the present invention is applied, the reference numeral 2 is an inputting portion, 3 is a display portion, and 4 is a connector used to connect the data collector 1 to another information processing device (not shown).

Figure 2:
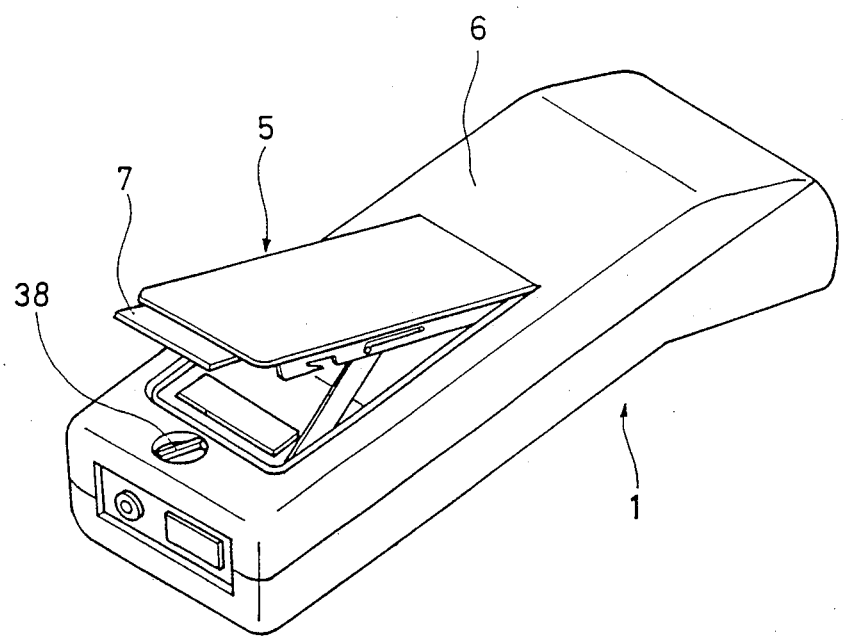
FIG. 2 a perspective view of the data collector which is turned up showing a relationship between the data collector and the memory card storage service according to the present invention.

It is noted that the memory card storage device 5 of the present invention is formed in a rear case 6 of the data collector 1 as shown in FIG. 2.

A structure of the storage device 5 will be described with reference to FIGS. 3–9.

A lid 8 functions both as a cover of the rear case 6 and a holder in which the memory card 7 is held. The lid 8 is rotatably joined to the rear case 6 by means a of hinge 9 having a sectional shape of ]. The lid 8 has a peripheral edge 10 adapted to contact with a seal which will be described and a case portion 13 containing or receiving the memory card 7. The case portion 13 extends inwardly toward the interior of the data collector 1. The lid 8 also has a card connector 11 formed at about the center thereof. The card connector 11 is slidably fitted to the case portion 13 and a pair of slide links 14 are attached to both the sides of the card connector 11.

The case portion 13 has a square window 15 formed near the hinge side thereof. The card connector 11 has a set of connector pins 16 erected from the card connector so as to direct to the interIor of the data collector. The square window 15 is adapted to prevent the connector pins 16 from interfering or contacting with the case portion 13 when the card connector 11 slides.

Next, the rear case 6 has an opening 17 through which the lid 8 moves and the opening 17 has a seal groove 18 extending along the periphery thereof. A seal 19 is adapted to enter In the seal groove 18 and the peripheral edge 10 of the lid contacts firmly with the seal 19. A bag portion 20 is formed on the interior of the opening 17 near the side or end opposite to the hinged end. A pair of shaft supporters 21 extend from an outside face of the bag portion 20. A pair of or a single revolving links 23 are pivoted revolvingly on the shaft supporters 21 through a pair of or a single pins 22 and have a pair of slide pins 24 fixed to their ends The slide pins 24 are engaged with oval openings 25 formed in the slide links 14. The long axis of the oval opening is placed or directed at a right angle to the sliding direction of the slide links 14. The slide pins 24 have portions extending through the oval openings 25 and the portions slidably engage with L-shaped openings 27 formed in a pair of side walls 26 of the case portion 13. These side walls 26 have a front pair and a rear pair of notches 30 and these notches are adapted to engage with engagement portions 29 attached on the lock plate 28. The notch 30 consists of an entrance portion 31 through which the engagement portion 29 can enter and go out, and a cut-in portion 32 provided with a tapered face with which the engagement portion 29 engages.

Figure 3:
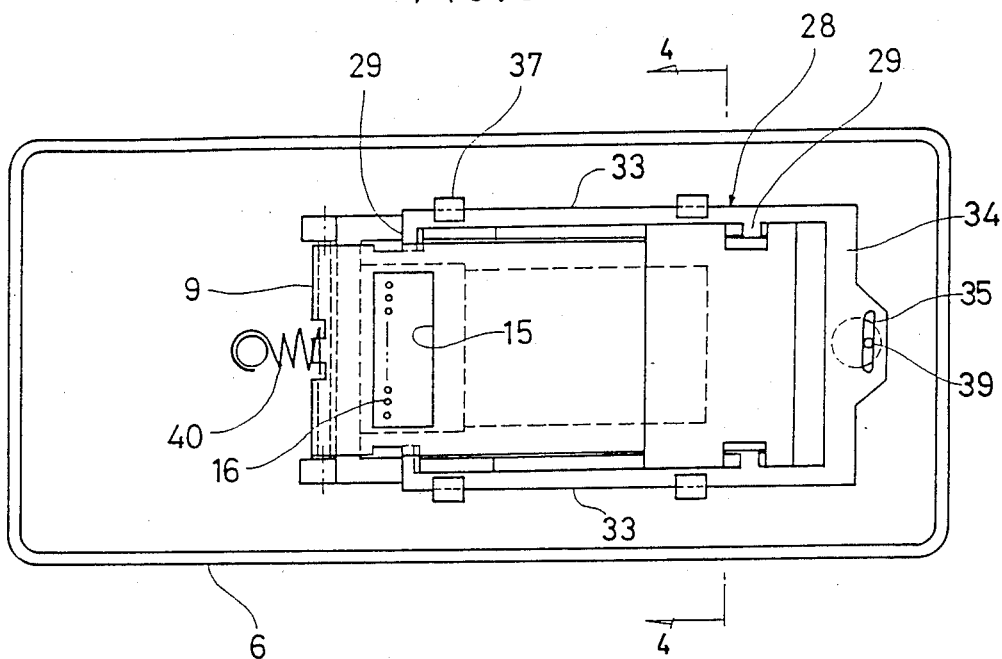
FIG. 3 is a cross-sectional view taken along the lines A—A shown in FIG. 1.
Figure 4:
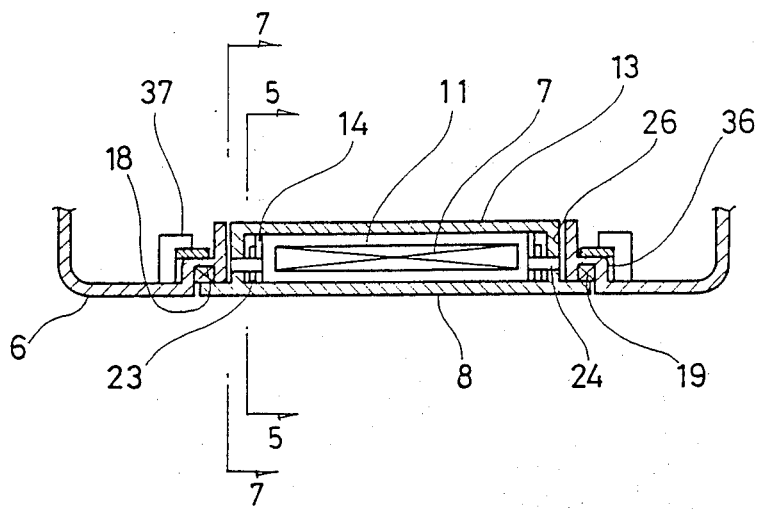
FIG. 4 a sectional view taken along the line B —B in FIG. 3.
Figure 5:
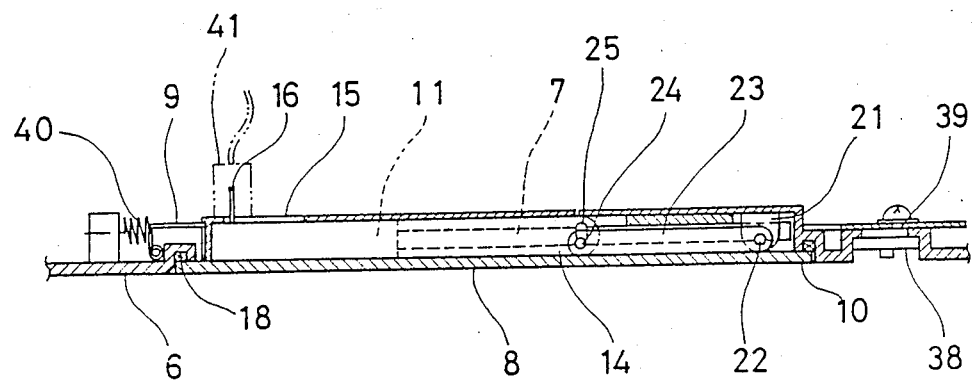
FIG. 5 is a sectional view taken along the line C—C in FIG. 4.

The lock plate 28 has a shape of ] in plane so as to embrace the opening 17 as shown in FIG 3. These two engagement portions 29 are formed on the inside of two opposite portions 33 of the lock plate 28 so as to extend inwardly. The upper edge of the engagement portion 29 is chamfered so as to smoothly engage with the notch 30. A cross-portion 34 connecting these opposite portions 33 has a slit 35 extending longitudinally of the cross-portion 34. The lock plate 28 ia placed on a stepped portion 36 having the seal groove 18 and held slidably by a lock plate pressor 37.

A lock knob 38 is rotatably attached on the rear case 6 at its opposite part to the hinged portion of the storage device 5. A pin 39 is planted at an eccentric position of the lock knob 38 and the pin 39 fits to the slit 35.

As shown in FIG. 3, 40 shows a compression spring pressing the lid 8 along its open direction. 41 is a connector connected to the body of the data collector 1. 42 is a cushion restraining useless rattling of the memory card 7 when the card is inserted to the memory card storage device.

The operation of the card collector 1 with the memory card storage device 5 will be explained with reference to the drawings.

FIGS. 3,4,5 and 7,, respectively shows the card collector 1 with the card storage device 5 and the memory card 7 stored in the device. In the stored condition, the engagement portion 29 of the lock plate 28 engages with the cut-in portion 32 and the lid 8 is locked in its closed position.

Figure 6:
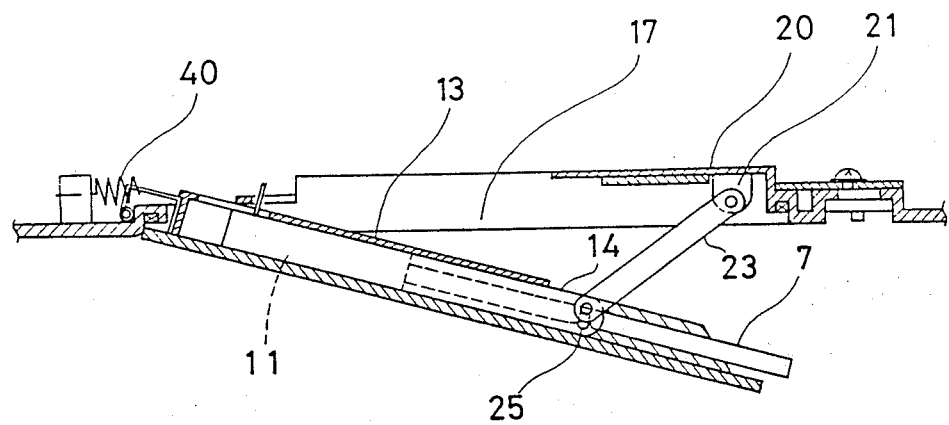
FIG. 6 depicts the data collector the lid of which is open.
Figure 7:
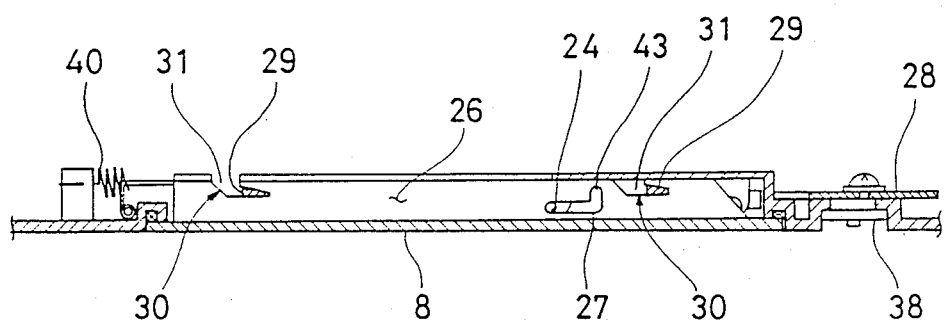
FIG. 7 is a sectional view taken along the line D—D in FIG. 4 with the lid is closed.
Figure 8:
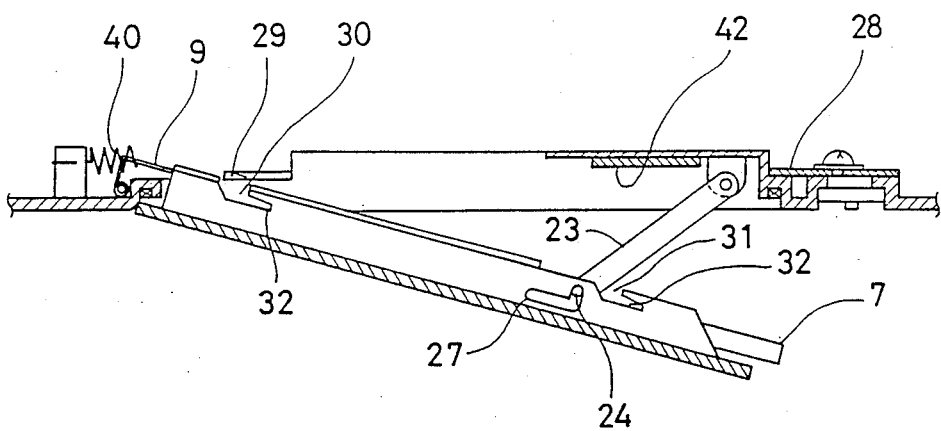
FIG. 8 depicts the data collector with the lid is open.
Figure 9:
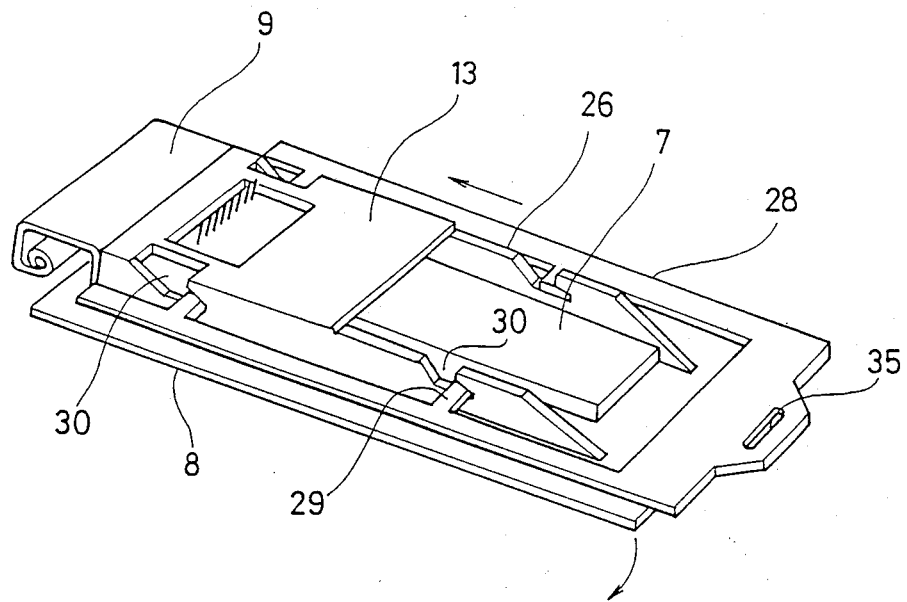
FIG. 9 is a perspective view showing the relationship of the lid to a lock plate.

In order to take out the memory card 7, turn the lock knob 38 by 180 degree. Because the pin 39 as explained above is planted at the position which is eccentric from the rotary center of the lock knob 38, the pin 39 moves toward the hinged side 9 of the card connector 11 by the distance twice as large as the volume of eccentricity. A movement of the pin 39 makes the lock plate 28 slide toWard the hinged portion. When the lock plate 28 slides and the engagement portion 29 coincides with the entrance portion 31 of the notch 30, the locked condition of the lid 8 is released and the lid 8 opens a little by the force of the compression spring 40. When a manual force is applied to the lid 8 in order to open it additionaly, the lid 8 rotates as shown in FIGS. 6 and 8 clockwise the revolving link 23 rotates counterclockwise, the slide pin 24 moves in the L-shaped opening 27 toward the end side of the lid 8, and the slide link 14 connected to the revolving link 23 by means of the slide pin 24 slides toward the end of the lid 8 together with the card connector 11. When the slide pin 24 reaches the end point of its stroke, the slide pin enters a detent 43 of the L-shaped opening 27 by an opening movement of the lid 8. A right-angle movement of the slide pin 24 along its sliding direction is permitted by the oval opening 25 formed in the slide link 14. This condition is the final open position of the lid 8, in which condition a sliding of the card connector 11 makes a front edge of the memory card 7 extend a little from the front end of the lid 8.

Then, the operator can easily remove the memory card 7 out of the data collector 1. When the slide pin 24 engages with the dent 43 of the L-shaped opening 27 as described above and the lid 8 is open as shown in FIG. 8, the slide pin 24 is held in its condition in which its sliding movement is restrained. As a result, the lid 8 is held firmly in its fixed condition during insertion of the memory card 7 into the card connector 11 and a complete fitting or engagement of the card and the connector is attained.

When the card connector 11 is to be stored, the lid 8 is closed after the slide pin 4 is removed from the dent 43 and the slide pin 24 is released for sliding. Additional closing operation of the lid 8 and a movement of the revolving link 23 push the card connector 11 and close the lid 8 after the memory card 7 is completely stored in the case portion 13.

Closing the lid 8 and pressing it with a little force along the closing direction, the lock knob 38 is turned. By the movement of the eccentric pin 39 as described above, the lock plate 28 moves toward the front end of the lid 8 and the engagement portion 29 engages with the cut-in portion 32 attaining a locked condition of the lid 8.

Engagement of the engagement portion 29 with the cut-in portion 32 is smoothly attained by the chamfered engagement portion 29 and the tapered face of the cut-in portion 32. In addition, a wedging effect of the wedge engagement portion 29 in the cut-in portion 32 deforms the seal 19 enabling the lid 8 to lock firmly and seal effectively.

According to the embodiments of the memory card storage device of the present invention, the lid 8 is locked by means of the eccentric pin and the lock plate However, a knurled screw may be used to obtain the same effect as that mentioned above. Also the compression spring for giving a pressing force to the lid 8 along its opening direction may be replaced by a torsion spring adapted to rotate the revolving link counterclockwise.

Figure 10:
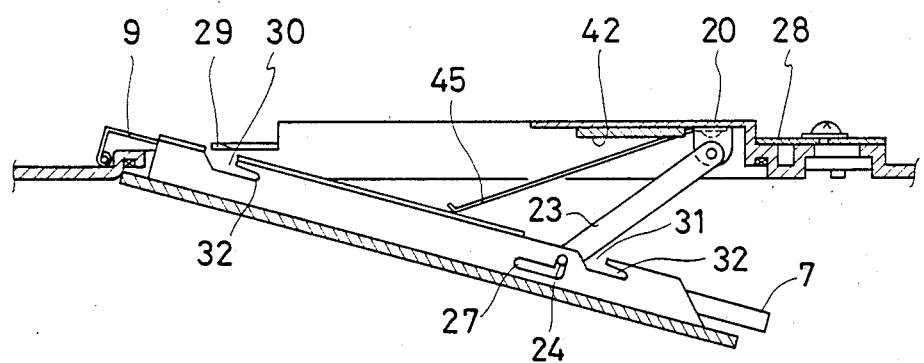
FIG. 10 shows another embodiment of the data collector adopted in a data collector with the lid is open.

Alternatively, as shown in FIG. 10 depicting another embodiment of the present invention, a leaf spring 45 is fixed to the outside face of the bag portion 20 so as to apply an opening force to the lid 8. It may be possible to fix pivotably the slide link 14 to the card connector 11 so as to make the front end of the slide link 14 swing by the distance or length of the L-shaped detent 43 by making simply the slide link 14 and the revolving link 23 fixed to each other pivotably.

Although only two embodiments of the present invention have been disclosed and described, it is apparent that other embodiments and modifications of the invention are possible. It is of course that the present invention can be applied to other electric devices than the data collector described above.

What is claimed is:

1. A memory card storage device adapted to be used in electronic apparatus using memory cards, which device comprises a main body case having an opening, a lid having movable end and a pivot end rotatably joined to said case so as to cover said opening and having a case portion formed on its inner surface, a card connector slidably installed in the case portion, said card connector being able to receive a memory card, a revolving link having a first end and a second end pivotally connected to a part of said main body case at said first end near said movable end, said second end of said revolving link being connected to said card connector whereby the action of opening the lid causes said revolving link to revolve and thereby cause said card connector to slide in the lid to push the memory card.

2. The memory card storage device according to claim 1, wherein said card connector includes a slide link, said slide link being connected to said second end of said revolving link through a pin, said lid having a L-shaped opening, said pin being slidably fitted into said L-shaped opening.

3. The memory card storage device according to claim 1, further comprising a spring mounted upon said case and adapted to open a lock plate provided with engagement portions, said lock plate being slidably mounted on said main body case and wherein said lid has notches positioned so as to be engageable with said engagement portions, whereby a slide movement of said lock plate makes said notches and said engagement portion alternately engaged or disengaged.

4. The memory card storage device according to claim 3, further comprising a lock knob rotatably attached to said main body case and having an eccentric pin, said lock plate having a slit, said eccentric pin being received in said slit.

* * * * *